(12) United States Patent
Draxelmayr et al.

(10) Patent No.: US 7,429,941 B1
(45) Date of Patent: Sep. 30, 2008

(54) STABILIZATION OF SIGMA-DELTA CONVERTERS

(75) Inventors: Dieter Draxelmayr, Villach (AT); Markus Schimper, Moosinning (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/753,504

(22) Filed: May 24, 2007

(51) Int. Cl.
*H03M 3/00* (2006.01)

(52) U.S. Cl. .................................. 341/143; 341/155

(58) Field of Classification Search ................ 341/143, 341/155, 161
See application file for complete search history.

(56) References Cited

U.S. PATENT DOCUMENTS

| | | | | |
|---|---|---|---|---|
| 5,894,283 A * | 4/1999 | Fischer et al. | ............... | 341/161 |
| 5,986,598 A * | 11/1999 | Mittel | ............... | 341/143 |
| 6,831,577 B1 * | 12/2004 | Furst | ............... | 341/143 |
| 2005/0190865 A1 * | 9/2005 | Lazar et al. | ............... | 375/340 |

* cited by examiner

*Primary Examiner*—Peguy JeanPierre
(74) *Attorney, Agent, or Firm*—Lee & Hayes, PLLC

(57) ABSTRACT

This disclosure relates to monitoring the output of one or more amplifying structures and providing an auxiliary input signal under certain conditions.

20 Claims, 4 Drawing Sheets

STABILIZATION OF SIGMA-DELTA CONVERTERS

BACKGROUND

Sigma-delta conversion has been generally understood for many years. Recent technological advances make devices utilizing sigma-delta conversion more attractive and their use is becoming more widespread. Sigma-delta converters are useful in such applications as communications systems and wireless Local Area Networks (LAN). These converters provide high dynamic range and flexibility in converting low bandwidth input signals. The general principle of the sigma-delta architecture is to make rough evaluations of the signal and to measure, integrate, and compensate for errors in the evaluation.

FIG. 1 shows a simple block diagram of a conventional first order sigma-delta Analog-to-Digital Converter (ADC) system 100. The sigma-delta converter 100 has two primary constituents: a sigma-delta modulator 102 and a digital filter 104. An input signal X is fed into the sigma-delta modulator 102, through a junction 106, and to an amplifying structure 108, such as an integrator, resonator, and/or passive structure (capacitor, resistor, inductor, and so forth). The amplifying structure 108 distributes the converter quantization error, or quantization noise, such that it is very low in the band of interest according to well known techniques. The amplifying structure 108 outputs a signal that is input to a comparator 110. This system (e.g. system 100) can act as a single-bit or multi-bit quantizer or ADC. The output of the comparator 110 is directed to a feedback Digital-to Analog Converter (DAC) 112, which outputs an analog approximation signal Q back to junction 106 as part of a feedback loop. The analog signal Q is subtracted at the junction from the analog input signal X in an attempt to reduce in-band quantization noise and to force the average of the signal Q to be equal to the input signal X. The resulting output signal is sent through the comparator 110 and provided as an output signal from the sigma-delta modulator 102 to the digital filter 104, which may be a decimation filter. The digital filter 104 outputs a digital signal Y with certain characteristics, such as desired bandwidth and so forth.

The first order sigma-delta converter 100 tends to have a high level of quantization noise when the analog signal is quantized. The quantization noise, or quantization error noise, limits the dynamic range of the first order sigma-delta converter 100. To decrease this noise, one or more additional amplifying structures may be added to create a high order sigma-delta converter. A sigma-delta converter having two amplifying structures is referred to as a second order converter, a converter having three amplifying structures is referred to as a third order converter, and so forth. Increasing the order of the converter and, thus, decreasing the quantization noise in the output signal, leads to certain benefits such as a higher input signal bandwidth, a reduced clock rate, and/or an increased output precision. However, higher order sigma-delta converters, particularly those with a single feedback loop, are prone to stability problems, which lead to undesired results such as a loss of a connection or a signal. Since stability also depends on input signal conditions, which are not always known, mathematical treatment and/or simulation do not lead to complete solutions.

There are several solutions known in the art to address the stability problem with high order sigma-delta converters. For example, the converter may be made more stable by designing it with a "less aggressive" noise shaping function. However, making the converter more stable in this manner increases quantization noise and reduces the Signal-to-Noise Ratio (SNR), which are undesired effects. Another option to increase the stability is through a process known as "graceful degradation." According to the graceful degradation process, the order (e.g. the number of amplifying structures) of the loop is reduced based on the detection of overflow conditions in an effort to stabilize the signal. Usually, this approach is inaccurate and often requires complex and costly circuitry overhead. Another option quite often employed is the implementation of a "reset," in which if an overflow condition or instability is detected, the circuit is reset by canceling out the signal at one or more amplifying structures. The sigma-delta conversion operation must then be reinitiated, which leads to a temporary loss of information. Such a loss of information is intolerable in many systems, such as LANs and other communication systems.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques for stabilizing a signal being passed through a high order sigma-delta converter. The sigma-delta converter may be implemented as part of an ADC converter, such as may be used in telecommunications applications. In one described implementation, multiple amplifying structures are connected in series with a single feedback loop. A monitoring mechanism is associated with at least one of the amplifying structures and is capable of detecting instability in a signal output by the amplifying structure. In such instances where instability is detected, the monitoring mechanism may direct an auxiliary input signal to be input to the amplifying structure to stabilize the amplifying structure's output signal. Because the stability of the system is monitored, more aggressive signal shaping (i.e. noise suppression) is possible.

According to another implementation, a method is provided for processing a first input signal through an amplifying structure in a high order sigma-delta converter to generate a stable output signal. The signal output by the amplifying structure is monitored. The monitored signal is compared to a threshold value, which may be based on the maximum or minimum operating characteristics of the amplifying structure, to determine whether the output signal exceeds the threshold value. If the output signal exceeds the threshold value, e.g., if the output signal approaches the minimum or maximum handling characteristics of the amplifying structure, an auxiliary input signal with a predetermined characteristic is combined with the first input signal. If the output signal does not exceed the threshold value, the auxiliary input signal is not combined with the first input signal.

The techniques described herein may be implemented in a number of ways. One example environment and context is provided below with reference to the included figures and on going discussion.

Exemplary Systems

Figure 2:
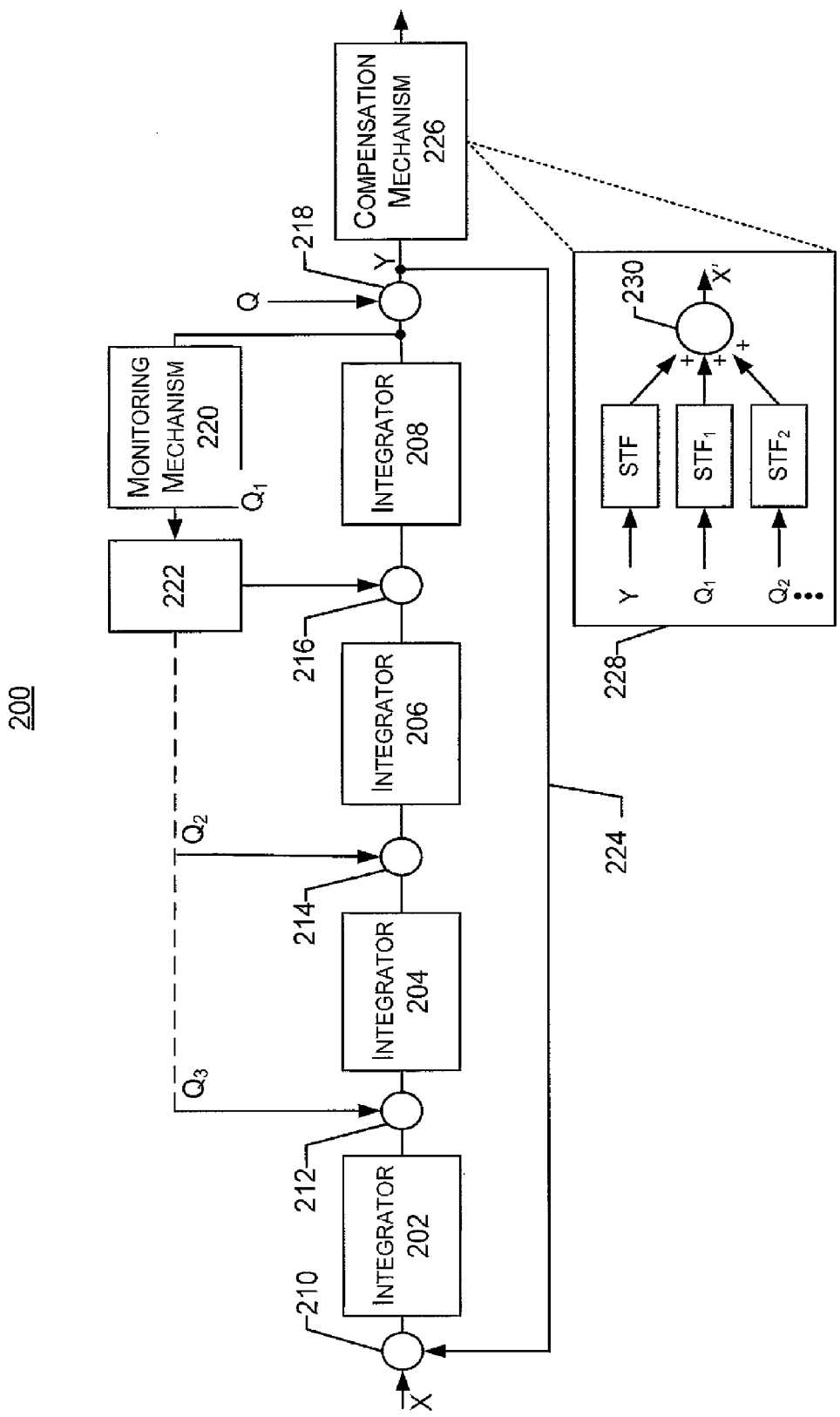
FIG. 2 is a block diagram of a fourth-order sigma-delta loop with a watch mechanism to monitor a signal output by an amplifying structure.

FIG. 2 illustrates one implementation of a high order sigma-delta converter system 200. In this example, the converter system 200 is a fourth order converter system, although other high orders may be employed, such as a three or five order converter system. Generally, the sigma-delta converter system 200 includes junctions, amplifying structures (integrators, resonators, and/or passive structures), and one or more monitoring mechanisms. The sigma-delta converter system 200 can also be implemented with other electrical systems or components. For example, the sigma-delta converter system 200, may be connected in series with a digital filter to form an ADC. Such systems or components are well understood by those skilled in the art and are not shown for the sake of simplicity.

The system 200 may have one or more amplifying structures, such as the integrators designated 202, 204, 206, and 208. The integrators may be connected in series through junctions 210, 212, 214, 216, and 218. For example, the output of integrator 202 is sent through junction 212 and input into integrator 204 and so forth. A monitoring mechanism 220, or watch circuit, is connected to one or more of the integrators to detect signal output(s) from the associated integrator(s). The monitoring mechanism 220, which may be a comparator, an operational amplifier, or the like, may determine whether a signal overflow condition exists, or is approaching, by comparing the signal output from the integrator(s) to a reference signal.

For instance, suppose the monitoring mechanism 220 is connected to detect the output signal of integrator 208. The overflow condition of integrator 208 may be characterized by a signal that approaches the rails of the integrator 208 (e.g., in a nonlinear region of the integrator 208, such as Vdd or ground supply rails). At such a point, the output signal of the integrator 208 is roughly known. The monitoring mechanism 220 issues a command to an auxiliary input signal generator 222 which, in response, generates a known auxiliary input signal $Q_1$ that is provided at junction 216 to stabilize the signal passing through the converter and to avoid the overflow condition. The signal generator 222 may additionally or alternatively be operable to generate auxiliary input signals $Q_2$ and $Q_3$, which are input at junctions 214 and 212 as shown by the dotted line in FIG. 2.

The sigma-delta converter system 200 has a single feedback loop 224. The feedback loop 224 may have a DAC or other feedback components, which are well understood by those skilled in the art and are not shown for the sake of simplicity. The sigma-delta converter system experiences a certain unknown level of quantization noise, which is represented in the figure by the reference "Q." The quantization noise Q is random or white noise that results from conversion of the analog signal to a digital signal. The digital signal may be returned to junction 210 directly or it may be converted using a DAC.

Figure 1:
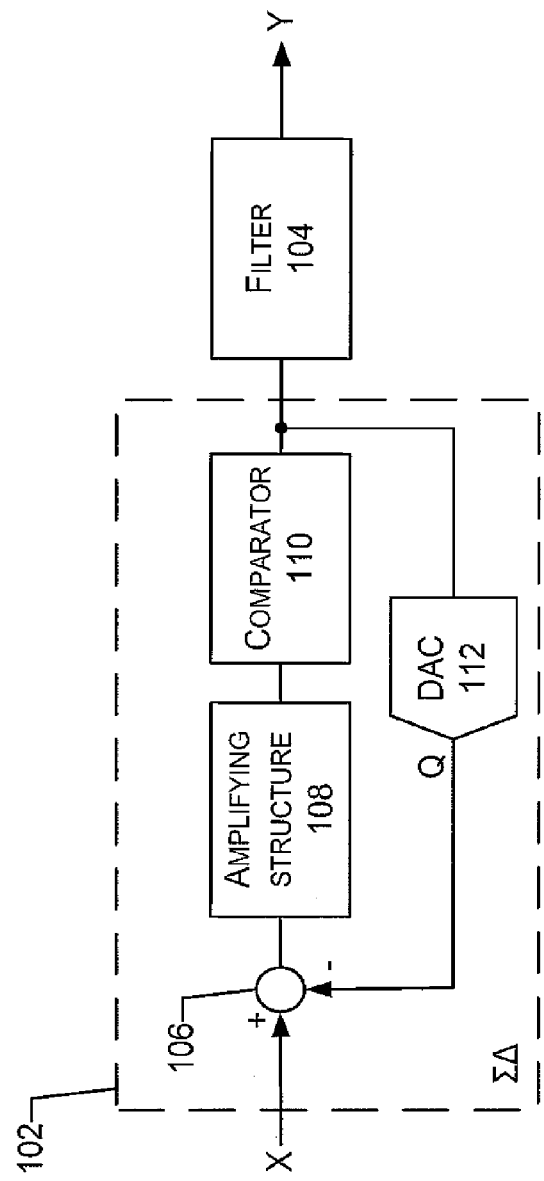
FIG. 1 is a block diagram of a conventional first-order sigma-delta converter having a feedback loop.

To address the influence of the auxiliary signals, the typical decimation filter, e.g. filter 104 in FIG. 1, is replaced or modified with a compensation mechanism 226 to add the "Qi*STFi" terms. A schematic of the compensation mechanism is shown in box 228, where the output of the summation node 230 is X', an approximation of input signal X. With the aid of the compensation and monitoring mechanisms, it is possible to design for more aggressive noise shaping.

Figure 3:
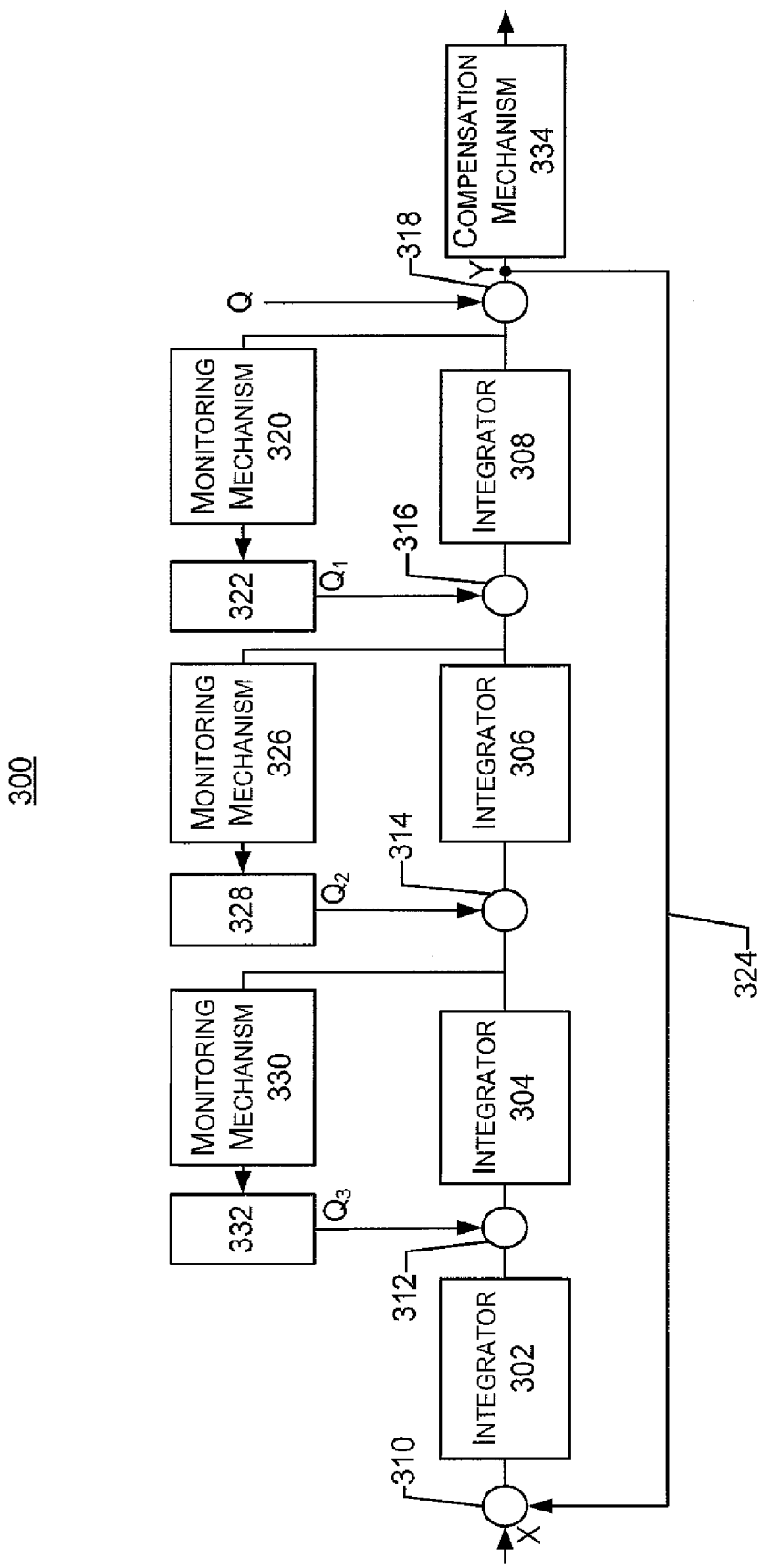
FIG. 3 is a block diagram of a fourth-order sigma-delta loop with watch mechanisms associated with individual amplifying structures to monitor the signal output by each monitored amplifying structure.

FIG. 3 shows an implementation that is similar to the implementation shown in FIG. 2, with the exception that a monitoring mechanism and signal generator are associated with individual amplifying structures, such as integrators 302, 304, and/or 306. As described above, amplifying structures may additionally or alternatively comprise integrators, resonators, and/or passive structures. For discussion purposes, similar components in FIGS. 2 and 3 may be labeled with similar reference numbers that differ only by the leftmost digit (i.e., 200 series for FIG. 2 and 300 series for FIG. 3). Here, as in FIG. 2, a monitoring mechanism 320 detects the signal output by integrator 308. In response, a signal generator 322 provides an auxiliary signal $Q_1$ to junction 316 to stabilize the signal passing through the converter and prevent an overflow with regard to integrator 308. Unlike the system of FIG. 2, however, the system 300 in FIG. 3 further includes a monitoring mechanism 326 to detect the signal output by integrator 306. In response, signal generator 328 provides the auxiliary signal $Q_2$ to junction 314 in order to stabilize the signal passing through the converter and prevent an overflow with regard to integrator 306. Likewise, monitoring mechanism 330 detects the signal output by integrator 304 and, in response, directs signal generator 332 to provide the auxiliary signal $Q_3$ to junction 312.

Similar to monitoring mechanism 220 in FIG. 2, any monitoring mechanism may control an auxiliary input signal provided to an integrator that is located before the monitored integrator in the series. Also, monitoring mechanisms and auxiliary input signals may be associated with certain integrators and not with others, as desired. For example, monitoring mechanism 326 and signal generator 328 could be removed from the system without diverting from the scope of this disclosure. A compensation mechanism 334, which may be implemented as hardware, software, or a combination thereof, may be inserted at the output of the sigma delta converter 300 to address the influence of the auxiliary signals, as described with respect to FIG. 2.

Although the sigma-delta converter systems 200 and 300 are shown as fourth order systems, each with a single feed back loop, this implementation is meant to serve only as a non-limiting example. The sigma-delta converter system described herein could be of a smaller or larger order. For example, the sigma-delta converter system could be implemented as a first through seventh order converter. Additionally, as described above, amplifying structures may comprise integrators, resonators, and/or passive structures. Furthermore, feedback and/or feedforward loops could be inserted to any junctions between adjacent converters and/or cascaded architecture could be employed as is well understood in the art of single loop sigma-delta converters.

Exemplary Process

Figure 4:
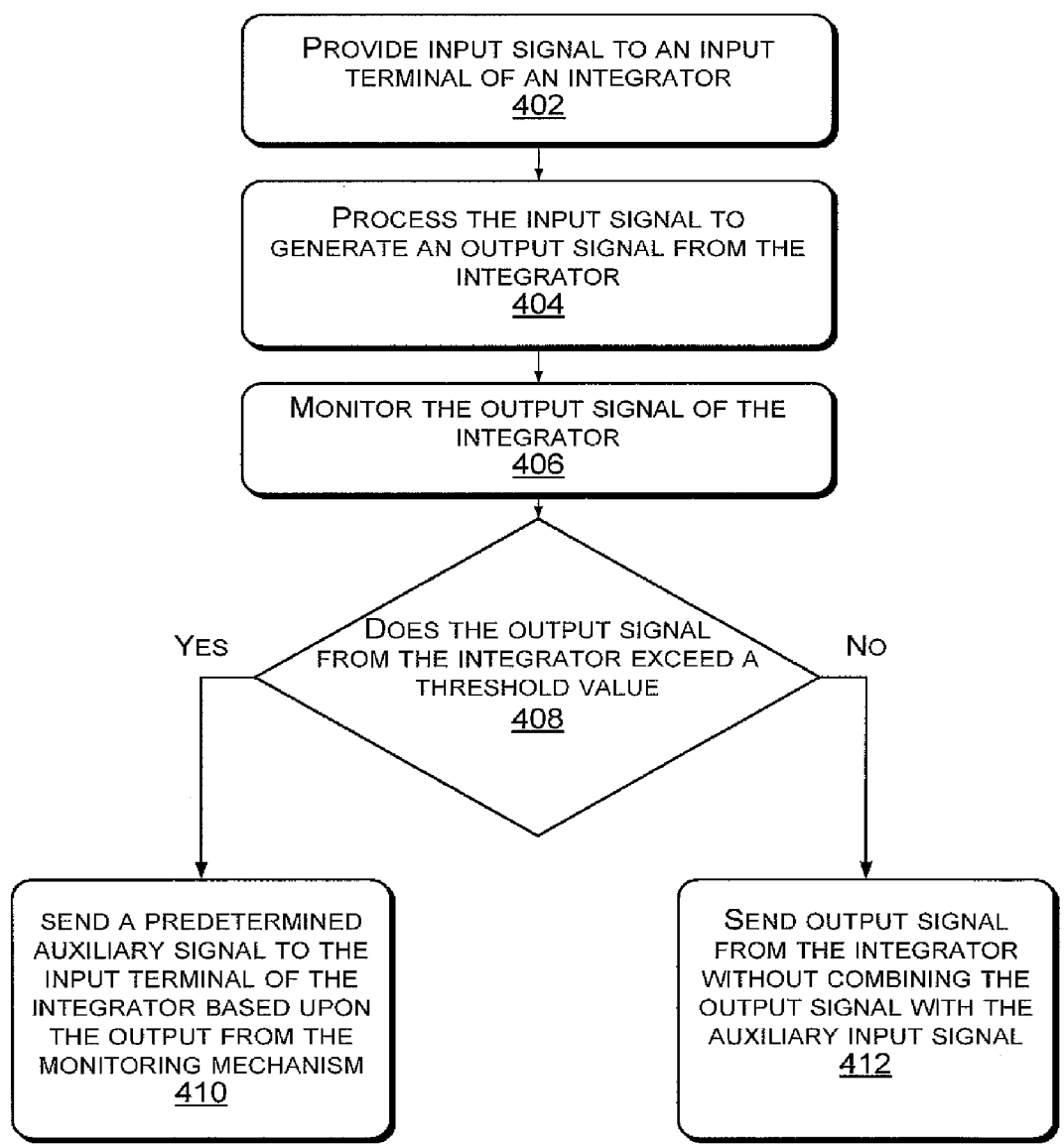
FIG. 4 is a flow diagram of a process for monitoring and modifying the output of an amplifying structure.

FIG. 4 shows one example implementation of a process 400 for monitoring and modifying the output signal of a given integrator in order to stabilize a signal being passed through a sigma-delta converter without introducing unacceptable levels of quantization noise. As described above, the integrator could be replaced with a resonator or a passive structure.

Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

At 402, a first input signal is provided to an input terminal of an integrator. According to this implementation, the input signal is an analog signal, such as signal X in FIG. 2, that is to be converted to a digital signal. Before reaching the integrator, the input signal may pass through one or more junctions and/or other integrators, such as those shown in systems 200 and 300.

At 404, the signal is processed by the integrator to produce an output. For example, the integrator may generate a one-bit output signal.

At 406, the output signal is monitored. In systems 200 and 300, the monitoring mechanisms perform this act of monitoring. The monitoring mechanism may be a comparator or other device for measuring the signal voltage.

At 408, the monitoring mechanism determines whether the output signal from the integrator exceeds a threshold value. The threshold value may be predetermined based upon, for example, the maximum or minimum handling characteristics of the integrator. For example, the threshold value may be determined to be a value where the signal has a value that approaches the maximum or minimum handling characteristics of the integrator. Thus, in a 1 V system in which the zero point is set at 0.5 V, the threshold value may be 0.1 or 0.9 volts and exceeding the threshold voltage may constitute a signal value lower than 0.1 V or higher than 0.9 V, respectively. Of course, this concept also applies to fully differential structures, where the signal magnitude is given by voltage differences that have positive and negative values. In such instances, exceeding the value may constitute exceeding a positive or negative value, e.g., having a positive voltage higher than +0.8V (i.e., 0.9V −0.1V) or having a negative voltage lower than −0.8 V (i.e., 0.1V −0.9V). Moreover, the threshold value may be based on the change in the value in a given time. For example, a change in value from −0.7V to +0.7V in a given time period may be set as a threshold value. Exceeding that change would therefore be determined by the monitoring mechanism as exceeding the threshold value.

At 410, if the output signal of the integrator exceeds the threshold value, an auxiliary signal is sent to the input terminal of the integrator in order to return the signal to a safe operating region. This safe operating region may be the linear operating region of the integrator.

At 412, if the output signal of the integrator does not exceed the threshold value, the signal is sent from the integrator without inputting the auxiliary input signal.

The system in FIG. 2 may be used for reference in describing one aspect of providing an auxiliary signal based upon the output from the monitoring mechanism. When an overflow condition is detected by the monitoring mechanism 222, an auxiliary input signal $Q_1$ is combined with the input signal, i.e., the output of integrator 206, for a given period, such as one clock cycle. The inserted auxiliary signal $Q_1$ is a charge, voltage, or current selected to return output from integrator 208 to a predetermined operating condition, such as a safe operating region for the integrator or other system component. The output of the integrator 208 need not reach a well known state. Instead, it is sufficient that the output reaches a state which is within the "safe operating area" and that the auxiliary input signal, e.g., $Q_1$, is known. For example, if the integrator 208 has a maximum input voltage handling characteristic of 1 V and the output of the integrator 208 is 0.9V, the monitoring mechanism 222 senses this condition and directs an auxiliary input signal of −0.5 V be provided to junction 218 to reduce the voltage of the signal back to a safe operating condition, which in this example would be around 0.4 V.

Additionally or alternatively, the output of previous integrators 206 and 204 may be altered by one or more of auxiliary input signals $Q_2$, and/or $Q_3$, respectively. These auxiliary input signals may be controlled by monitoring mechanism 220 or each integrator may have its own monitoring mechanism so that the output from each integrator is monitored and modified individually. The level of auxiliary input signals $Q_1$ through $Q_3$ may be controlled and maintained using resistors and or capacitors. Configurations of resistors and capacitors for controlling signals input at junctions are well understood and, therefore, any further discussion may be dispensed.

Monitoring and modifying the output for each integrator significantly improves stability of the signal. Conversion accuracy is not reduced as a result of inputting the auxiliary signals because, as mentioned above, the auxiliary input signals are pre-selected based on the signal received by the monitoring mechanism. Therefore, the effect of the auxiliary input signals can be compensated or accounted for mathematically. The transfer characteristic of such a system can be written as follows:

$$X=(Y*STF)+(Q*NTF)+(Q_1*STF_1)+(Q_2*STF_2)+(Q_3*STF_3)+(Q_4*STF_4)+\ldots$$

In this equation, X is the original input signal and is generally unknown. Y is the output signal, which typically is known. Q is the quantization noise, which is unknown. $Q_1$, $Q_2$, and so forth are the auxiliary input signals, which have known values. $STF_i$ and NTF are known transfer functions. It is therefore possible to compensate for the influence of the auxiliary signals by taking them into account as a part of the signal processing application. The higher order noise cancellation effect is therefore achieved by combining the individual outputs with their individual signal transfer functions in the digital domain.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. For example, the systems described could be configured as DACs, ADCs, or any feedback loop with a sequential structure. Moreover, the integrators described above could be replaced with other elements, such as resonators and/or passive structures.

The invention claimed is:

1. A system comprising:
an amplifying structure operable to receive an input signal and generate and output signal;
a monitoring mechanism operable to:
detect and receive the signal output from the amplifying structure, and
determine whether the output signal is approaching a predetermined value; and
an auxiliary input signal generator operable to receive a signal output by the monitoring mechanism and to provide an auxiliary input signal to the amplifying structure to return the output signal of the amplifying structure to a predetermined operating condition based upon the determination of the monitoring mechanism.

2. A system as recited in claim 1, wherein the amplifying structure is an integrator, a resonator, or a passive device.

3. A system as recited in claim 1, wherein the monitoring mechanism is a comparator.

4. A system as recited in claim 1, wherein the predetermined value is based on a maximum or minimum handling characteristic of the amplifying structure.

5. A system as recited in claim 1, wherein the amplifying structure is a first amplifying structure and the system further comprises a second amplifying structure, and further wherein the first amplifying structure is connected to receive an output signal from the second amplifying structure, the second amplifying structure is connected to received an output signal from the first amplifying structure to form a sigma-delta converter with a feedback loop.

6. A system as recited in claim 5, wherein the auxiliary input signal generator is operable to provide auxiliary input signals to at least one of the first and second amplifying structures based upon the output of the monitoring mechanism.

7. A system as recited in claim 5, wherein:
the monitoring mechanism is a first monitoring mechanism;
the auxiliary input signal generator is a first auxiliary input signal generator; and
the system further comprises a second monitoring mechanism operable to detect and receive a signal output from the second amplifying structure, and determine whether the signal output from the second amplifying structure is approaching the predetermined value, and
a second auxiliary input signal generator operable to provide a second auxiliary input signal at the input terminal of the second amplifying structure based upon the determination of the second monitoring mechanism.

8. A system as recited in claim 1, further comprising a compensation mechanism operable to compensate for the influence of the auxiliary input signal.

9. In a high order sigma-delta converter having multiple amplifying structures, a device comprising:
a monitoring mechanism operably coupled to:
receive a signal from one of the amplifying structures, and
determine whether the signal is approaching a predetermined value; and
an auxiliary input signal generator operably responsive to the monitoring mechanism to provide an auxiliary input signal to the one amplifying structure to return an output of the one amplifying structure to a predetermined operating condition based upon whether the signal is determined by the monitoring mechanism to be approaching the predetermined value.

10. A device as recited in claim 9, wherein the sigma delta converter is connected to a compensation mechanism operable to take into account the auxiliary input signal provided to the amplifying structure.

11. A device as recited in claim 9, wherein the multiple amplifying structures are between two and seven integrators that are connected in series.

12. A device as recited in claim 11, wherein the signal output by the last amplifying structure in the series is provided to the first amplifying structure in the series to form a feedback loop.

13. A device as recited in claim 9, wherein the monitoring mechanism is a comparator and the amplifying structure is an integrator, resonator, or passive structure.

14. A method comprising:
processing a first input signal through an amplifying structure to generate an output signal;
monitoring the output signal;
determining whether the output signal exceeds a threshold value; and
if the output signal exceeds the threshold value, combining a second input signal with the first input signal, the second input signal having a predetermined characteristic.

15. A method as recited in claim 14, wherein the predetermined characteristic is a known value of charge, voltage, or current.

16. A method as recited in claim 14, wherein determining whether the output signal exceeds a threshold value comprises comparing the output signal from the amplifying structure to a reference signal.

17. A method as recited in claim 14, wherein combining a second input signal with the first input signal is performed for one clock cycle.

18. A method as recited in claim 14, further comprising compensating for the influence of the second input signal.

19. A method as recited in claim 14, wherein if the output signal does not exceed the threshold value, the second input signal is not combined with the first input signal.

20. A method as recited in claim 14, wherein determining whether the output signal exceeds a threshold value is based on the maximum or minimum handling characteristics of the integrator.

* * * * *